United States Patent
Noh et al.

(10) Patent No.: US 9,443,920 B2
(45) Date of Patent: Sep. 13, 2016

(54) ORGANIC LIGHT EMITTING DIODE DISPLAY HAVING HIGH APERTURE RATIO AND METHOD FOR MANUFACTURING THE SAME

(71) Applicant: LG DISPLAY CO., LTD., Seoul (KR)

(72) Inventors: Soyoung Noh, Goyang-si (KR); Jeongoh Kim, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 28 days.

(21) Appl. No.: 14/469,055

(22) Filed: Aug. 26, 2014

(65) Prior Publication Data

US 2015/0060814 A1    Mar. 5, 2015

(30) Foreign Application Priority Data

Aug. 27, 2013    (KR) .................. 10-2013-0101623

(51) Int. Cl.
*H01L 51/56* (2006.01)
*H01L 27/32* (2006.01)
*H01L 27/12* (2006.01)

(52) U.S. Cl.
CPC ......... *H01L 27/3272* (2013.01); *H01L 27/124* (2013.01); *H01L 27/1255* (2013.01); *H01L 27/3265* (2013.01)

(58) Field of Classification Search
CPC ............................. H01L 27/3225; H01L 51/56
USPC ......................................................... 257/40
See application file for complete search history.

(56) References Cited

U.S. PATENT DOCUMENTS

| | | | | |
|---|---|---|---|---|
| 2005/0104814 A1* | 5/2005 | Choi | .................... | G09G 3/3233 345/76 |
| 2006/0267885 A1* | 11/2006 | Kwak | ................... | G09G 3/3233 345/76 |
| 2010/0079419 A1* | 4/2010 | Shibusawa | .......... | H01L 27/3272 345/204 |
| 2011/0108844 A1* | 5/2011 | Kwak | ................... | G09G 3/3233 257/71 |
| 2011/0297941 A1* | 12/2011 | Zhan | ....................... | H01L 28/87 257/59 |
| 2012/0313100 A1* | 12/2012 | Liu | ..................... | H01L 27/1214 257/59 |
| 2013/0015459 A1* | 1/2013 | Lee | ..................... | H01L 27/3265 257/72 |
| 2013/0026541 A1* | 1/2013 | Kurokawa | .......... | H01L 21/8252 257/195 |
| 2013/0112975 A1* | 5/2013 | Choi | .................... | H01L 27/1248 257/59 |
| 2013/0120338 A1* | 5/2013 | Kubota | .................... | G06F 3/038 345/211 |
| 2013/0270527 A1* | 10/2013 | Kwon | ................. | H01L 33/0041 257/40 |
| 2014/0061606 A1* | 3/2014 | Kim | ........................ | H01L 23/48 257/40 |
| 2014/0077184 A1* | 3/2014 | Im | ....................... | H01L 27/3265 257/40 |
| 2014/0158995 A1* | 6/2014 | Park | .................... | H01L 27/3262 257/40 |
| 2014/0217410 A1* | 8/2014 | Hsu | ....................... | H01L 21/845 257/59 |
| 2015/0022938 A1* | 1/2015 | Okada | ..................... | H01G 4/33 361/278 |
| 2015/0043126 A1* | 2/2015 | Hurwitz | ................. | H01L 28/65 361/303 |

* cited by examiner

Primary Examiner — Moazzam Hossain
(74) Attorney, Agent, or Firm — Birch, Stewart, Kolasch & Birch, LLP

(57) ABSTRACT

The present disclosure relates to an organic light emitting diode display having high aperture ratio and a method for manufacturing the same. The present disclosure suggests an organic light emitting diode display comprising: a plurality of pixel areas disposed in a matrix manner on a substrate; a thin film transistor disposed in the pixel area; an organic light emitting diode connected to the thin film transistor and disposed in the pixel area; and a three-stack storage capacitor having four electrodes connected to the thin film transistor and the organic light emitting diode.

12 Claims, 11 Drawing Sheets

FIG. 8 though as many steps as possible, but in uneven and/or rugged
ORGANIC LIGHT EMITTING DIODE DISPLAY HAVING HIGH APERTURE RATIO AND METHOD FOR MANUFACTURING THE SAME This application claims the benefit of Korean Patent Application No. 10-2013-0101623 filed on Aug. 27, 2013, which is incorporated herein by reference for all purposes as if fully set forth herein.

BACKGROUND OF THE INVENTION

1. Field of the Invention

The present disclosure relates to an organic light emitting diode display having high aperture ratio and a method for manufacturing the same. Especially, the present disclosure relates to a bottom emission type organic light emitting diode display and a method for manufacturing the same, in which the four electrodes are overlapped each other for forming the storage capacitor ensuring more storage capacitor with minimized plane area.

2. Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or EL).

The electroluminescence display device is categorized in the inorganic light emitting diode display device and the organic light emitting diode display device according to the luminescence material. As a self-emitting display device, the electroluminescence display device has the merits those the response speed is very fast, the brightness is very high and the view angle is large.

Figure 1:
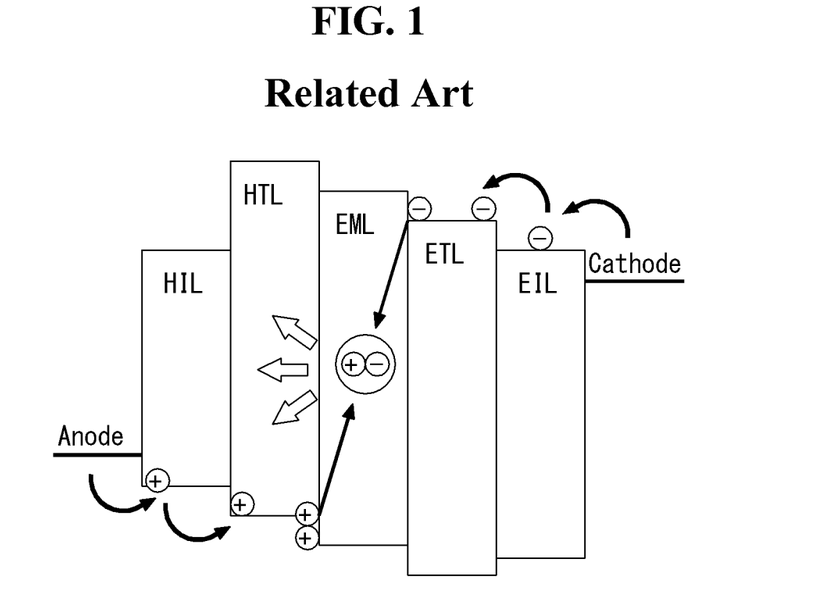
FIG. 1 is a diagram illustrating the structure of the organic light emitting diode according to the related art.

FIG. 1 is a diagram illustrating the structure of the organic light emitting diode. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL. The organic light emitting diode radiates the lights due to the energy from the excition formed at the excitation state in which the hole and the electron are recombined at the emission layer EML.

The organic light emitting diode radiates the lights due to the energy from the excition formed at the excitation state in which the hole from the anode and the electron from the cathode are recombined at the emission layer EML. The organic light emitting diode display can represent the video data by controlling the amount (or 'brightness') of the light generated and radiated from the emission layer ELM of the organic light emitting diode as shown in FIG. 1.

The organic light emitting diode display (or OLED) using the organic light emitting diode can be categorized in the passive matrix type organic light emitting diode display (or PMOLED) and the active matrix type organic light emitting diode display (or AMOLED).

The active matrix type organic light emitting diode display (or AMOLED) shows the video data by controlling the current applying to the organic light emitting diode using the thin film transistor (or TFT).

Figure 2:
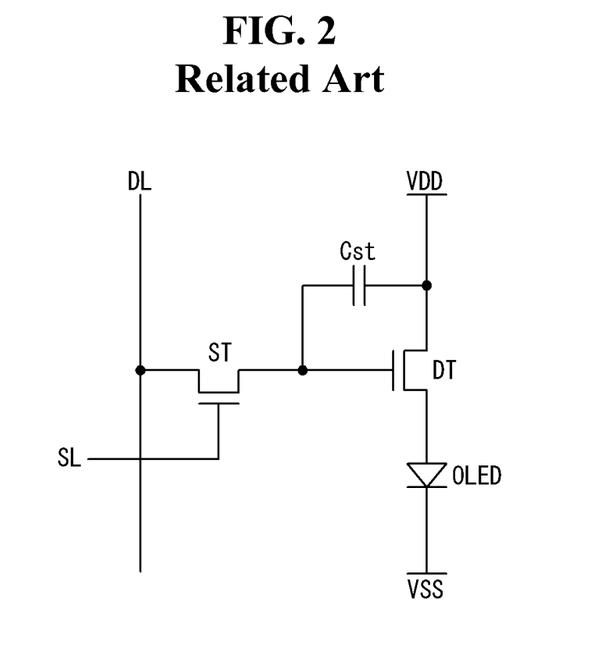
FIG. 2 is the exemplary circuit diagram illustrating the structure of one pixel in the active matrix organic light emitting diode display (or AMOLED) according to the related art.
Figure 3:
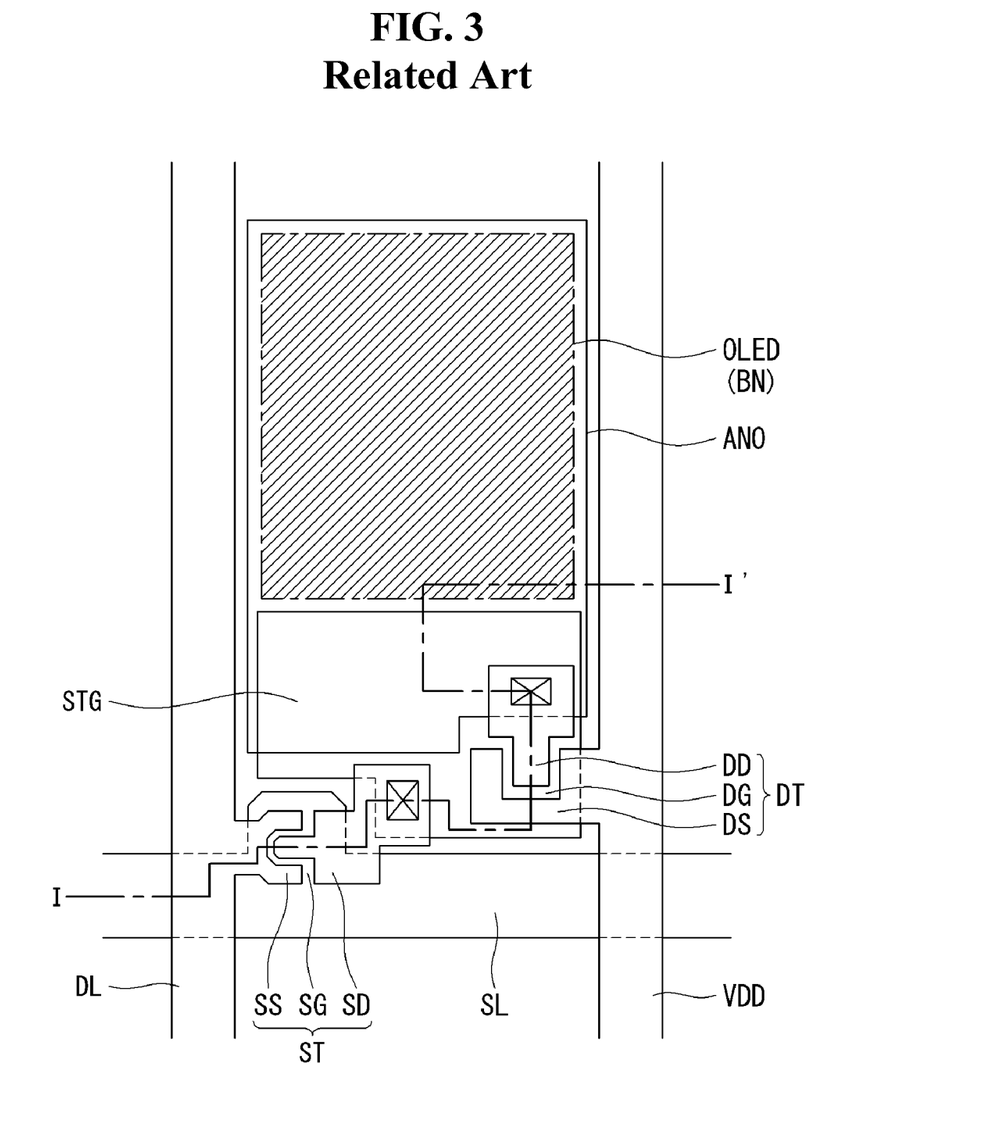
FIG. 3 is a plane view illustrating the structure of one pixel in the AMOLED according to the related art.
Figure 4:
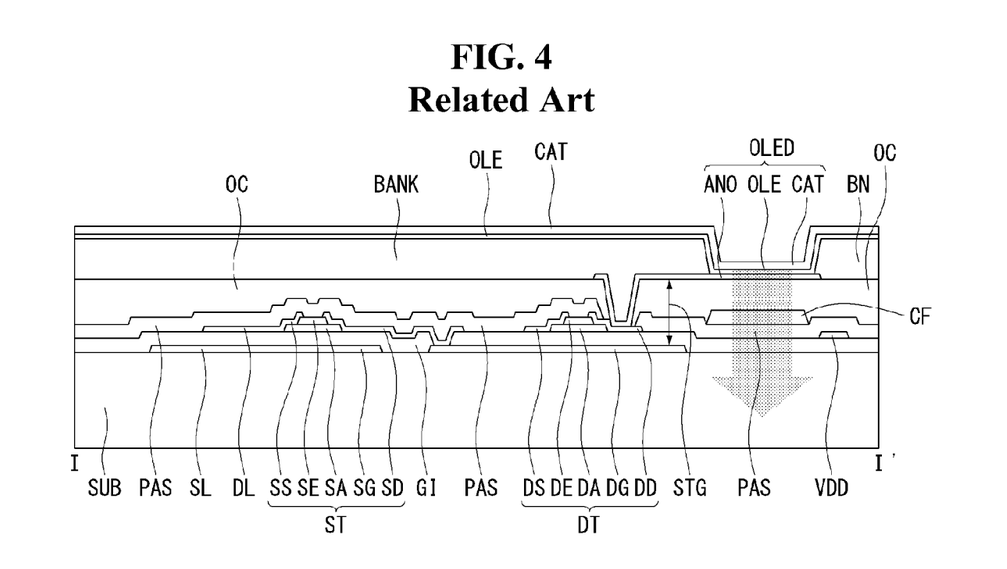
FIG. 4 is a cross sectional view along the cutting line I-I' for illustrating the structure of the AMOLED according to the related art.

FIG. 2 is the exemplary circuit diagram illustrating the structure of one pixel in the active matrix organic light emitting diode display (or AMOLED). FIG. 3 is a plane view illustrating the structure of one pixel in the AMOLED. FIG. 4 is a cross sectional view along the cutting line I-I' for illustrating the structure of the AMOLED.

Referring to FIGS. 2 and 3, the active matrix organic light emitting diode display comprises a switching thin film transistor ST, a driving thin film transistor DT connected to the switching thin film transistor ST, and an organic light emitting diode OLED connected to the driving thin film transistor DT.

The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OD disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLED.

Referring to FIG. 4 more detail, on the substrate SUB of the active matrix organic light emitting diode display, the gate electrodes SG and DG of the switching thin film transistor ST and the driving thin film transistor DT, respectively are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the contact hole penetrating the gate insulator GI. The passivation layer PAS is deposited on the substrate SUB having the switching thin film transistor ST and the driving thin film transistor DT.

Especially, in the case that the semiconductor layers SA and DA include the oxide semiconductor material, thanks to the characteristics of high electron mobility, it has merit for applied to a large area thin film transistor substrate having large charging capacitor. However, in order to ensure the stability of the oxide semiconductor material, it is preferable to include an etch stopper SE and DE covering the upper surface of channel area to protect them from etchants. In detail, the etch stoppers SE and DE would be formed to protect the semiconductor layers SA and DA from being back-etched by the etchant for patterning the source electrodes SS and DS and the drain electrodes SD and DD.

A color filer is formed at the area where the anode electrode ANO will be formed later. It is preferable for the color filter CF to have a large area as possible. For example, it is preferable to overlap with some portions of the data line DL, the driving current line VDD and/or the scan line SL. The upper surface of the substrate having these thin film transistors ST and DT and color filters CF is not in even and/or smooth conditions, but in uneven and/or rugged conditions having many steps. In order that the organic light emitting diode display has good luminescent quality over the whole display area, the organic light emitting layer OLE should be formed on an even or smooth surface. So, to make the upper surface in planar and even conditions, the over coat layer OC is deposited on the whole surface of the substrate OC.

Then, on the over coat layer OC, the anode electrode ANO of the organic light emitting diode OLED is formed. Here, the anode electrode ANO is connected to the drain electrode DD of the driving thin film transistor DT through the contact hole penetrating the over coat layer OC and the passivation layer PAS.

On the substrate SUB having the anode electrode ANO, a bank BANK is formed over the area having the switching thin film transistor ST, the driving thin film transistor DT and the various lines DL, SL and VDD, for defining the light emitting area. The exposed portion of the anode electrode ANO by the bank BANK would be the light emitting area. On the anode electrode ANO exposed from the bank BANK, the organic light emitting layer OLE is formed. On the organic light emitting layer OLE, the cathode electrode ACT is formed.

For the case that the organic light emitting layer OLE has a material emitting the white lights, each pixel can represent various colors by the color filter CF disposed under the anode electrode ANO. The organic light emitting diode display as shown in FIG. 4 is the bottom emission type display in which the visible light is radiated to the bottom direction of the display substrate.

In the bottom emission type organic light emitting diode display, the storage capacitor STG is formed where the gate electrode DG of the driving thin film transistor DT and the anode electrode ANO are overlapped. For the organic light emitting diode display, it can represent the video data by driving the organic light emitting diode. In general, the required energy for driving the organic light emitting diode is higher than any other electric element used for representing video data.

In order to exactly and quickly represent the moving video data of which electric data is very quickly varied, the large amount of the storage capacitor is required for the organic light emitting diode display. For ensuring enough storage capacitor, the surface area of the storage capacitor should be large. For the case of the top emission type organic light emitting diode display, as the storage capacitor can be formed by overlapping with the emission area, it can ensure enough large area of the storage capacitor without reduction of the aperture ratio. On the contrary, for the case of the bottom emission type organic light emitting diode display, as the area of the storage capacitor is getting larger, the area for representing light i.e., the aperture ratio would be reduced. That is, in the bottom emission type organic light emitting diode display, the area of the storage capacitor directly affects to the aperture ratio reduction.

SUMMARY OF THE INVENTION

In order to overcome the above mentioned drawbacks, the purpose of the present disclosure is to suggest a bottom emission type organic light emitting diode display in which the area of the storage capacitor is minimized for preventing the aperture ratio reduction, and a method for manufacturing the same. Another purpose of the present disclosure is to suggest a bottom emission type organic light emitting diode display in which four electrodes are overlapped each other for forming the storage capacitor so that the surface area of the storage capacitor can be minimized but the enough amount of the storage capacitor can be ensured, and a method for manufacturing the same.

In order to accomplish the above purpose, the present disclosure suggests an organic light emitting diode display comprising: a plurality of pixel areas disposed in a matrix manner on a substrate; a thin film transistor disposed in the pixel area; an organic light emitting diode connected to the thin film transistor and disposed in the pixel area; and a three-stack storage capacitor having four electrodes connected to the thin film transistor and the organic light emitting diode.

In one embodiment, the thin film transistor includes: a light shield layer blocking external lights induced to a channel layer and being a lower gate electrode; a buffer layer covering the light shield layer; a semiconductor layer having a channel layer overlapping with the light shield layer on the buffer layer; a upper gate electrode overlapping with the channel layer having a gate insulating layer there-between; an intermediate insulating layer covering the semiconductor layer and the upper gate electrode; and a source electrode and a drain electrode contact some portions of the semiconductor layer disposed both sides of the channel layer on the intermediate insulating layer.

In one embodiment, the three-stack storage capacitor includes: a first storage capacitor formed at some portions of the buffer layer disposed between an additional storage capacitor electrode and an intermediate electrode overlapped each other; a second storage capacitor formed at some portions of the gate insulating layer disposed between the intermediate electrode and a first storage capacitor electrode overlapped each other; and a third storage capacitor formed at some portions of the intermediate insulating layer disposed between the first storage capacitor electrode and a second storage capacitor electrode overlapped each other.

In one embodiment, the additional storage capacitor electrode is formed at the same layer and with the same material of the light shield layer, the first storage capacitor electrode is formed at the same layer and with the same material of the upper gate electrode, and the second storage capacitor electrode is extended from the drain electrode and connected to the intermediate electrode via a contact hole through the intermediate insulating layer and the gate insulating layer.

In one embodiment, the organic light emitting diode includes: an anode electrode formed on a passivation layer and an over coat layer covering the thin film transistor, and connected to the drain electrode exposed from the passivation layer and the over coat layer; an organic light emitting layer deposited on the anode electrode; and a cathode electrode deposited on the organic light emitting layer.

In one embodiment, the organic light emitting diode further comprises a color filter inserted between the passivation layer and the over coat layer and configured to define a light emitting area.

In one embodiment, the anode electrode includes a transparent conductive material, the cathode electrode includes a reflective metal material, and lights radiated from the organic light emitting layer radiates to the color filter.

Furthermore, the present disclosure suggests a method for manufacturing an organic light emitting diode display comprising: forming a light shield layer and an additional storage capacitor electrode; forming a buffer layer covering the light shield layer and the additional storage capacitor electrode; forming an intermediate electrode overlapping with the additional storage capacitor electrode on the buffer layer; forming a semiconductor layer including a channel layer overlapping with the light shield layer on the buffer layer; forming a upper gate electrode overlapping with the channel layer and a first storage capacitor electrode overlapping with the intermediate electrode on a gate insulating layer; forming a intermediate insulating layer covering the upper gate electrode and the first storage capacitor electrode and exposing both sides of the semiconductor layer and one end of the intermediate electrode; and forming a source electrode contacting to one side of the semiconductor layer, and a second storage capacitor electrode contacting to other side of the semiconductor layer and the intermediate electrode and overlapping with the first storage capacitor electrode.

In one embodiment, a first storage capacitor is formed at some portions of the buffer layer disposed between an additional storage capacitor electrode and an intermediate electrode overlapped each other; a second storage capacitor is formed at some portions of the gate insulating layer disposed between the intermediate electrode and a first storage capacitor electrode overlapped each other; and a third storage capacitor is formed at some portions of the intermediate insulating layer disposed between the first storage capacitor electrode and a second storage capacitor electrode overlapped each other.

In one embodiment, the method for manufacturing the organic light emitting diode display further comprises: depositing a passivation layer covering the source electrode, the drain electrode and the second capacitor electrode; forming a color filter defining a light emitting area on the passivation layer; forming an over coat layer covering the color filter and exposing some portions of the drain electrode; forming an anode electrode connecting to the drain electrode and covering the color filter on the over coat layer; depositing an organic light emitting layer on the anode electrode; and depositing a cathode electrode on the organic light emitting layer.

The organic light emitting diode display according to the present disclosure has the storage capacitor including four electrodes overlapped each other, so that the area ratio of the storage capacitor to the pixel area can be minimized. Therefore, the area of the non-display area including the storage capacitor in the pixel area can be minimized, so that the display area can be maximized. As the result, it is possible to get a bottom emission type organic light emitting diode display having the high aperture ratio. Further, using the method for manufacturing the thin film transistor substrate having four electrodes overlapped each other for forming the three-stack storage capacitor, it is possible to get a bottom emission type organic light emitting diode display having the high aperture ratio without increasing of any mask processor number.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 5:
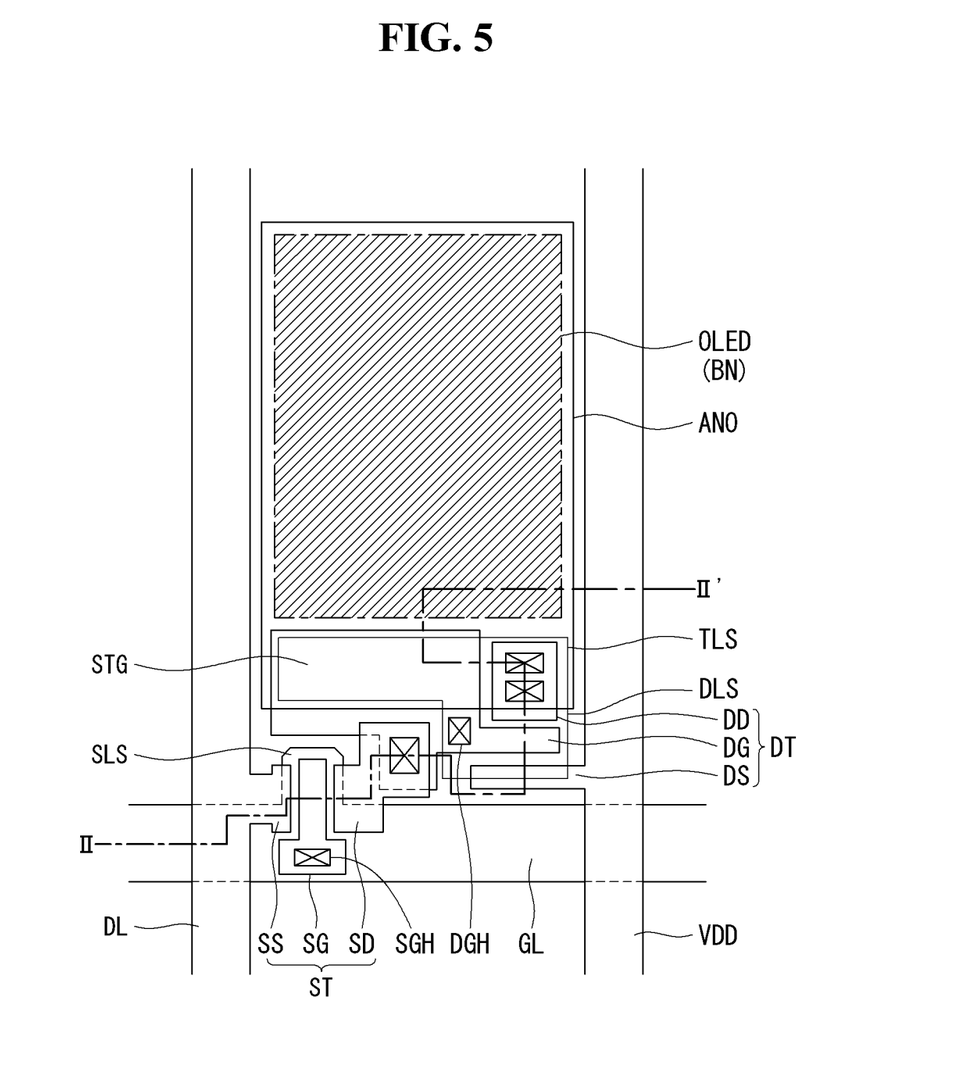
FIG. 5 is a plane view illustrating the structure of a bottom emission type organic light emitting diode display according to a preferred embodiment of the present disclosure.
Figure 6:
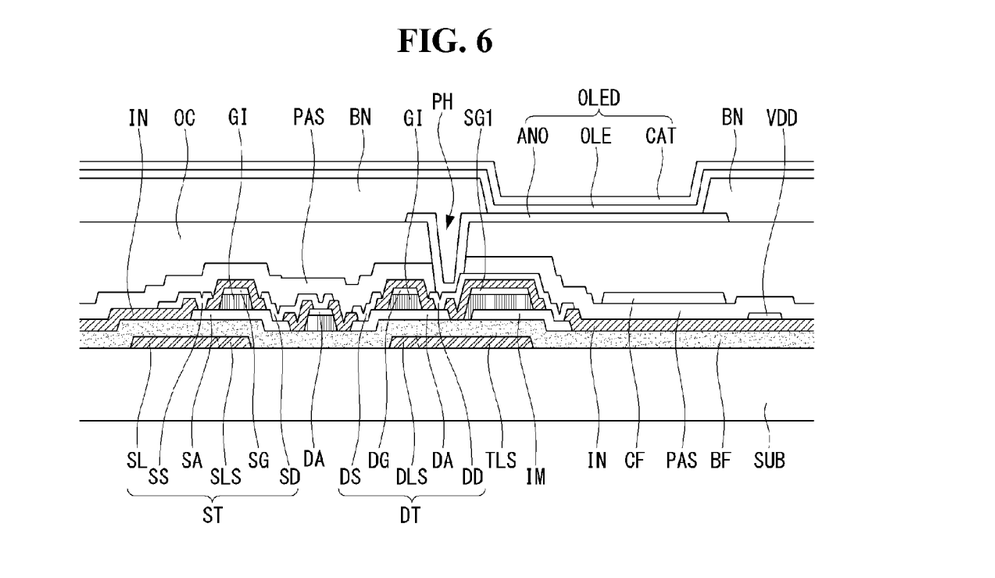
FIG. 6 is a cross sectional view along the cutting line of II-II' in FIG. 5 for illustrating the structure of an organic light emitting diode display according to the preferred embodiment of the present disclosure.

Hereinafter, referring to FIGS. 5 and 6, we will explain about an organic light emitting diode display according to a preferred embodiment of the present disclosure. FIG. 5 is a plane view illustrating the structure of a bottom emission type organic light emitting diode display according to a preferred embodiment of the present disclosure. FIG. 6 is a cross sectional view along the cutting line of II-II' in FIG. 5 for illustrating the structure of an organic light emitting diode display according to the preferred embodiment of the present disclosure.

Referring to FIGS. 5 and 6, an organic light emitting diode display according to the preferred embodiment of the present disclosure comprises a switching thin film transistor ST, a driving thin film transistor DT connected to the switching thin film transistor ST and an organic light emitting diode OLED connected to the driving thin film transistor DT.

The switching thin film transistor ST is formed where a scan line SL and a data line DL are crossing each other. The switching thin film transistor ST selects a pixel for representing video data. The switching thin film transistor ST includes a gate electrode SG branched from the scan line SL, a semiconductor layer SA, a source electrode SS and a drain electrode SD.

The driving thin film transistor DT drives an organic light emitting diode OLED of the pixel selected by the switching thin film transistor ST. The driving thin film transistor DT includes a gate electrode DG connected to the drain electrode SD of the switching thin film transistor ST, a semiconductor layer DA, a source electrode DS connected to the driving current line VDD and a drain electrode DD facing with the source electrode DS and being apart from the source electrode DS with a predetermined distance. The drain electrode DD of the driving thin film transistor DT is connected to an anode electrode ANO of the organic light emitting diode OLED.

Further, the organic light emitting diode display according to the preferred embodiment of the present disclosure comprises light shield layers SLS and DLS disposed under layer of the semiconductor (channel) layer SA and DA formed between the source electrodes SS and DS and the drain electrodes SD and DD for blocking the external light induced to the channel layer SA and DA. Especially, each of the light shield layers SLS and DLS is connected to the gate electrodes SG and DG, respectively so that the thin film transistors may have the double gate structure.

In addition, under the storage capacitor STG, an additional storage capacitor electrode TSL may be included. The additional storage capacitor electrode TSL is formed with the same material and at the same layer of the light shield layers SLS and DLS. As the additional storage capacitor electrode TSL is further included, the amount of the storage capacitor may be increased than the case of without the additional storage capacitor electrode TSL.

The amount of the storage capacitor is proportional to the permittivity (or dielectric constant) of the dielectric substance inserted between the two overlapped storage capacitor electrodes, and the surface of the two overlapped storage capacitor electrodes. When the additional storage capacitor electrode TSL is added at the storage capacitor, the amount of the storage capacitor may be increased as proportional to the area of the additional storage capacitor electrode TSL. In other words, even though the surface area of the storage capacitor STG is reduced, due to the additional storage capacitor electrode TSL, enough amount (or the same amount) of the storage capacitor can be ensured.

As the present disclosure further includes the additional storage capacitor electrode TSL, the surface area for forming the storage capacitor STG can be reduced. As the result, it is possible that the ratio of the effective light emission area (i.e., the area of the organic light emitting diode OLED) to the area of the anode electrode ANO may be increased. That is, the present disclosure suggests a high aperture ration organic light emitting diode display.

Further referring to FIG. 6, we will explain about the cross sectional structure of the organic light emitting diode display according to the present disclosure. On the substrate SUB, the light shielding layers SLS and DLS are disposed at the area where the semiconductor channel areas SA and DA of the switching thin film transistor ST and the driving thin film transistor DT, respectively, will be formed. The light shield layers SLS and DLS may be branched from the scan line SL. In that case, the light shield layers SLS and DLS can be used the bottom gate electrodes, for the case that the switching thin film transistor ST and the driving thin film transistor DT have the double gate structure.

At the area for the storage capacitor STG, the additional storage capacitor electrode TLS is formed. The additional storage capacitor electrode TLS may be formed as an isolated shape having the surface area corresponding to the storage capacitor. Otherwise, the additional storage capacitor electrode TLS may connected to the light shield layer DLS formed under the channel layer DA of the driving thin film transistor DT to have one body structure with the light shield layer DLS. Here, in convenience, the drawing for explain the preferred embodiment shows as the additional storage capacitor electrode TLS is extended from the light shield layer DLS of the driving thin film transistor DT.

On the whole surface of the substrate SUB having the scan line SL, light shield layers SLS and DLS and the additional storage capacitor electrode TLS, a buffer layer BF is deposited. On the buffer layer BF, an intermediate electrode IM overlapped with the additional storage capacitor electrode TLS is formed.

On the buffer layer BF covering the light shield layers SLS and DLS, semiconductor (channel) layers SA and DA are formed. On the semiconductor layers SA and DA, the gate insulating layer GI and the gate electrodes SG and DG are formed. The gate electrodes SG and DG are overlapped with the middle portions of the semiconductor layers SA and DA, respectively. At the both sides of the gate electrodes SG and DG, the source electrodes SS and DS and the drain electrodes SD and DD facing each other respectively are formed. The drain electrode SD of the switching thin film transistor ST is connected to the gate electrode DG of the driving thin film transistor DT through a contact hole formed at the intermediate insulating layer IN. On the whole surface of the substrate SUB having the switching thin film transistor ST and the driving thin film transistor DT, the passivation layer PAS is deposited.

On the passivation layer PAS, the color filter CF occupying the light emitting area corresponding to the anode electrode ANO is formed. It is preferable that the color filter CF has as larger area as possible. For example, the color filter CF may has the border line as closer to the data line DL, the driving current line VDD and the scan line SL as possible. The top surface of the substrate SUB having various elements including the color filter CF is not even but having level differences. In order to make the top surface of the substrate SUB even or smooth, an over coat layer OC may be deposited on the whole surface of the substrate SUB.

On the over coat layer OC, the anode electrode ANO of the organic light emitting diode OLED is formed. The anode electrode ANO is connected to the drain electrode DD of the driving thin film transistor DT via the contact hole formed at the over coat layer OC and the passivation layer PAS.

On the substrate SUB having the anode electrode ANO, a bank (pattern) BN covering the switching thin film transistor ST, the driving thin film transistor DT and various lines DL, SL and VDD is formed to define the light emitting area.

The exposed portions of the anode electrode ANO by the bank BN is defined as the light emitting area. On the surface of the substrate SUB having the bank BN, an organic light emitting layer OLE and the cathode electrode CAT are sequentially deposited. Here, the organic light emitting layer OLE has the organic material radiating the white color light. By the color filter CF disposed under the organic light emitting layer OLE, each pixel can represent colors of the video data. The organic light emitting diode display as shown in FIG. 6 is the bottom emission type in which the light for representing the video data radiates to bottom direction where the substrate SUB is disposed.

Hereinafter, referring to FIGS. 7A to 7K, we will explain about a method for manufacturing a bottom emission type organic light emitting diode display according to the preferred embodiment of the present disclosure, in detail. FIGS. 7A to 7K are cross sectional views illustrating a method for manufacturing a bottom emission type organic light emitting diode display according to the first embodiment of the present disclosure.

Figure 7A:
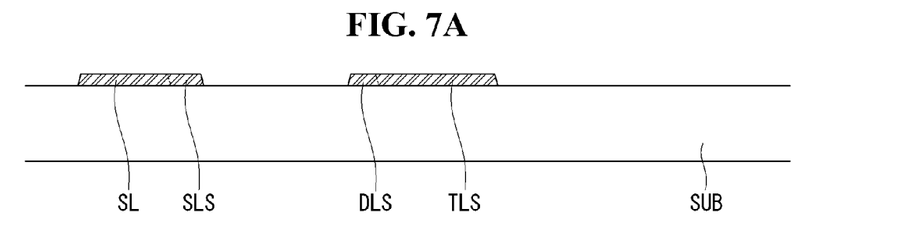
FIGS. 7A to 7K are cross sectional views illustrating a method for manufacturing a bottom emission type organic light emitting diode display according to the first embodiment of the present disclosure.

As shown in FIG. 7A, on a substrate SUB made of transparent glass or plastic material, an opaque metal material is deposited. By patterning the opaque metal material using the first mask process, a scan line SL, a light shield layer SLS of the switching thin film transistor ST, a light shield layer DLS of the driving thin film transistor DT and an additional storage capacitor electrode TLS are formed. The light shield layer SLS of the switching thin film transistor ST is formed at an area overlapping with the channel area SA of the switching thin film transistor ST. The light shield layer DLS of the driving thin film transistor DT is formed at an area overlapping with the channel area DA of the driving thin film transistor DT. In some cases, for the dual gate structure, the light shield layer SLS of the switching thin film transistor ST may be branched from the scan line SL. In the interim, the additional storage capacitor electrode TLS is formed where the storage capacitor STG is formed. FIG. 7A illustrates that, in convenience, the additional storage capacitor electrode TLS is extended from the light shield layer DLS of the driving thin film transistor DT.

Figure 7B:
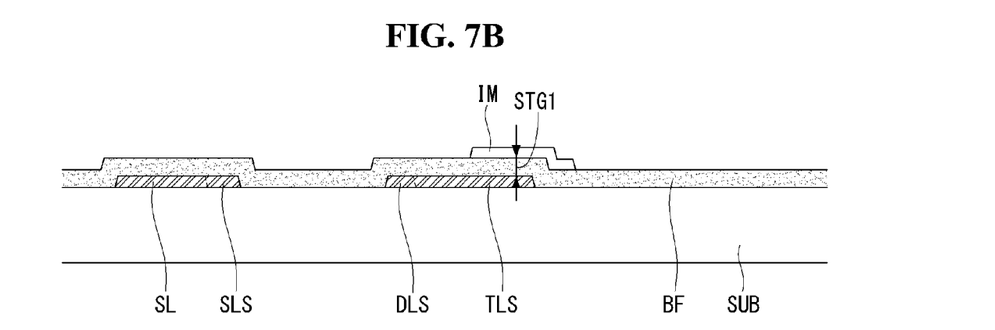

As shown in FIG. 7B, a buffer layer BF is formed by depositing an insulating material on the whole surface of the substrate SUB having the light shield layers SLS and DLS and the additional storage capacitor electrode TLS. Depositing a metal material on the buffer layer BF and patterning the metal material using the second mask process, an intermediate electrode IM is formed. As the result, the first storage capacitor STG1 is formed at the portions of the buffer layer BF, a dielectric material, inserted between the additional storage capacitor electrode TLS and the intermediate electrode IN.

Figure 7C:
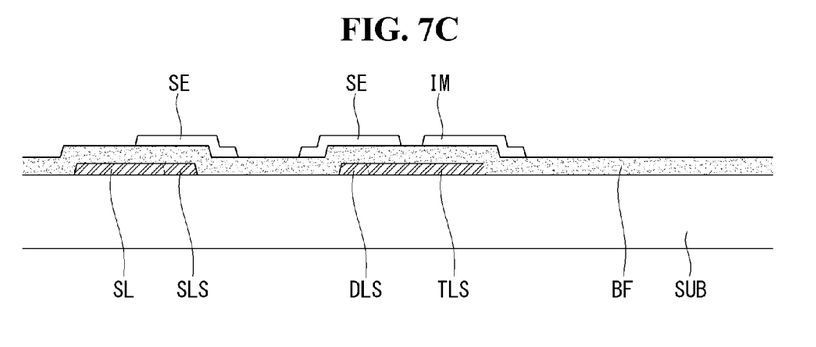

As shown in FIG. 7C, on the whole surface of the substrate SUB having the intermediate electrode IM, a semiconductor material is deposited. By patterning the semiconductor material using the third mask process, a semiconductor channel layer SE is formed. The semiconductor channel layer SE includes channel layers SA and DA of the switching thin film transistor ST and the driving thin film transistor DT, respectively. Therefore, the semiconductor layer SE has a shape as covering the light shield layer SLS of the switching thin film transistor ST and the light shield layer DLS of the driving thin film transistor DT.

Figure 7D:
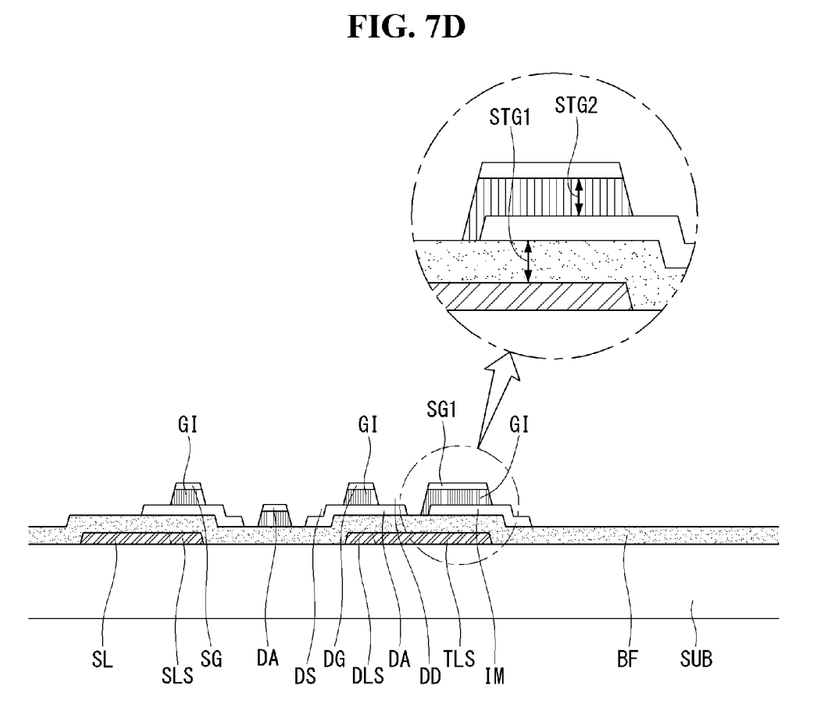

As shown in FIG. 7D, on the whole surface of the substrate SUB having the semiconductor layer SE, an insulating material and a metal material are sequentially deposited. By patterning the insulating material and the metal material at the same time using the fourth mask process, gate electrodes SG and DG and gate insulating layer GI overlapping with the semiconductor layer SE and a first storage capacitor electrode SG1. Here, the gate electrode SG of the switching thin film transistor ST is overlapped with the light shield layer SLS of the switching thin film transistor ST. Further, the gate electrode DG of the driving thin film transistor DT is overlapped with the light shield layer DLS of the driving thin film transistor DT. The gate electrodes SG and DG are overlapped with the some middle portion of the semiconductor layer SE and the both side portions of the semiconductor layer SE are exposed. The middle portions of the semiconductor layer SE is defined as the channel area SA of the switching thin film transistor ST and the channel area DA of the driving thin film transistor DT. The exposed side portions of the semiconductor layer SE are the ohmic areas for contacting to the source electrode and the drain electrode.

In the interim, the first storage capacitor electrode SG1 is formed as overlapping with the intermediate electrode IM. As the result, the second storage capacitor STG2 is formed at the portions of the gate insulating layer GI where the first storage capacitor electrode SG 1 and the intermediate electrode IM. Here, one end portions of the intermediated electrode IM would be exposed. Later, this exposed portions of the intermediate electrode IM may be connected to the second storage capacitor electrode SG2 for forming a third storage capacitor STG3. In another example, some portions of the light shields SLS and DLS may be exposed by additionally patterning the buffer layer BF. Even though in FIG. 7D is not shown, a switching gate contact hole SGH exposing some portions of the light shield layer SLS branching from the scan line SL and a driving gate contact hole DGH exposing some portions of the light shield layer DLS of the driving thin film transistor DT may be formed, as shown in FIG. 5. In this case, an additional mask process may be required. In other method, in the fourth mask process, a half-tone mask may be used for saving the additional mask.

Figure 7E:
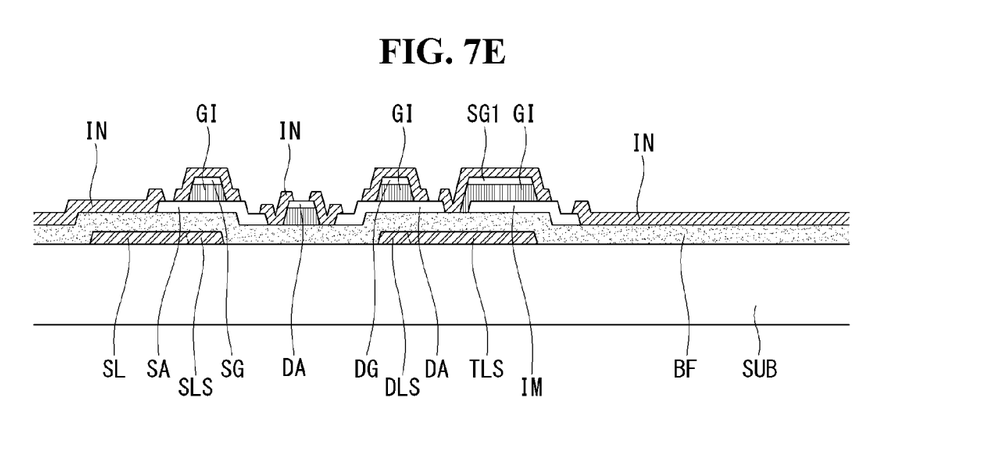

As shown in FIG. 7E, on the whole surface of the substrate SUB having the gate electrodes SG and DG and the first storage capacitor electrode SG1, an insulating material is deposited to form an intermediate insulating layer IN. By patterning the intermediate insulating layer IN using the fifth mask process, the contact holes for exposing the source areas and the drain areas of the semiconductor layer SE. Further, a contact hole for exposing some portions of the gate electrode DG of the driving thin film transistor DT is formed. In addition, a contact hole for exposing the one end portion of the intermediate electrode IM may be formed.

Figure 7F:
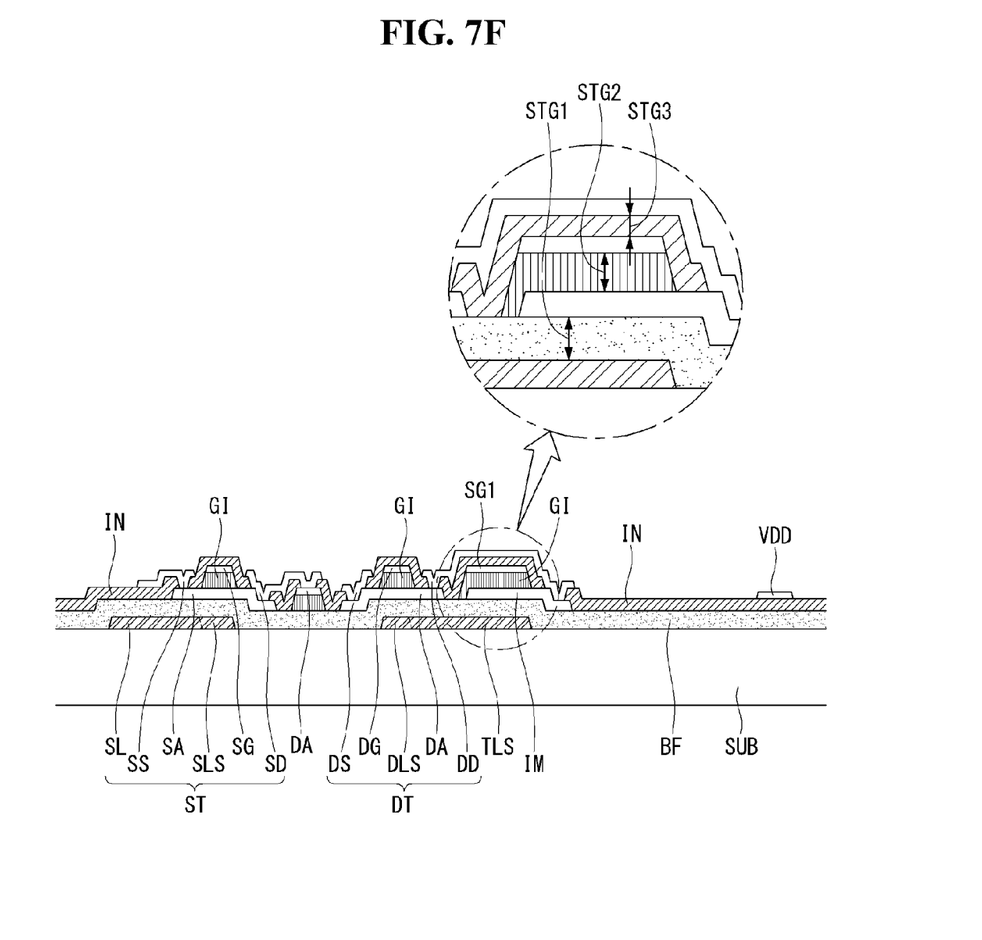

As shown in FIG. 7F, on the intermediate insulating layer IN, a source-drain metal material is deposited. By patterning the source-drain metal material using the sixth mask process, the source-drain electrodes of each thin film transistor, the data line DL and the driving current line VDD are formed. For example, a source electrode SS and a drain electrode DS of the switching thin film transistor ST and a source electrode DS and a drain electrode DD of the driving thin film transistor DT are formed. Here, the drain electrode SD of the switching thin film transistor ST is connected to the gate electrode DG of the driving thin film transistor DT. In the interim, the drain electrode DD of the driving thin film transistor DT is extended as overlapping with the first storage capacitor electrode SG1 to form the second storage capacitor electrode SG2. The second storage capacitor electrode SG2 is connected to the exposed portion of the intermediate electrode IM. As the result, the switching thin film transistor ST and the driving thin film transistor DT having the double gate structure are completed. Further, the third storage capacitor STG3 is formed at some portions of the intermediate insulating layer IN inserted between the second storage capacitor electrode SG2 and the first storage capacitor electrode SG1.

Figure 7G:
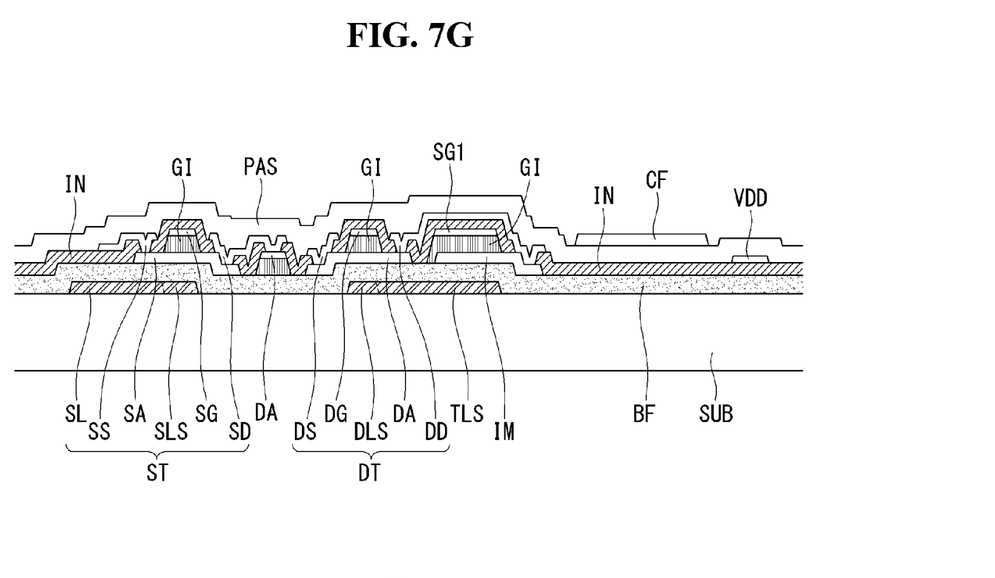

As shown in FIG. 7G, a passivation layer PAS is formed by depositing an insulating layer on the whole surface of the substrate SUB having the thin film transistors St and DT. Depositing a dye material on the passivation layer PAS and patterning the dye material using the seventh mask process, a color filter CF is formed within the pixel area. When a red color filter, a green color filter and a blue color filter are individually formed, the seventh mask process may include at least three sub-mask processes. The individual color filter CF is formed within the pixel area surrounded and defined by the scan line SL, the data line DL and the driving current line VDD. In another example, for maximizing the color filter CF area, some portions of the color filter CF may be overlapped with the scan line SL, the data line DL and/or the driving current line VDD.

Figure 7H:
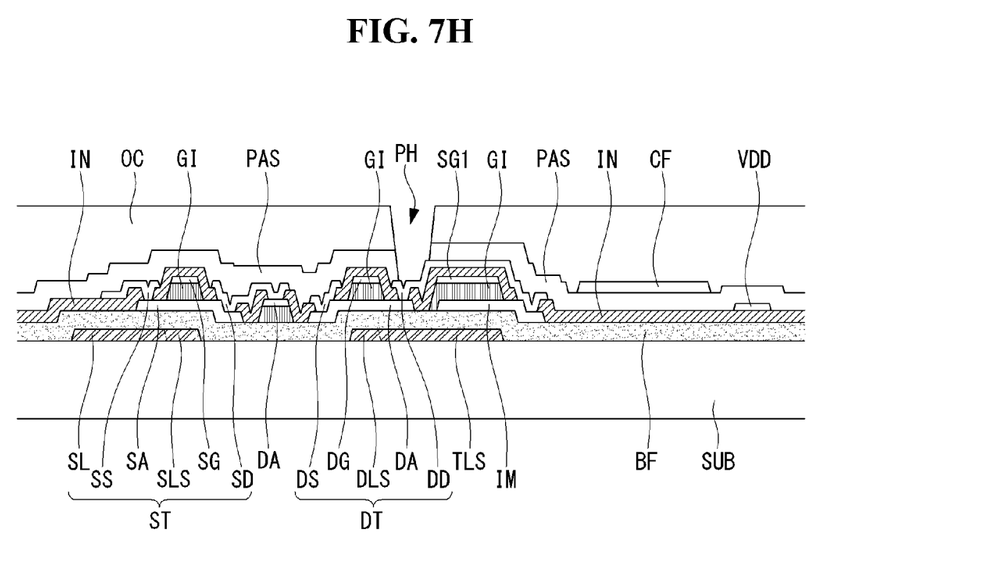

As shown in FIG. 7H, on the whole surface of the substrate SUB having the color filter CF, an over coat layer OC is deposited. By patterning the over coat layer OC and the passivation layer PAS using the eighth mask process, a pixel contact hole PH exposing some portions of the drain electrode DD of the driving thin film transistor DT is formed.

Figure 7I:
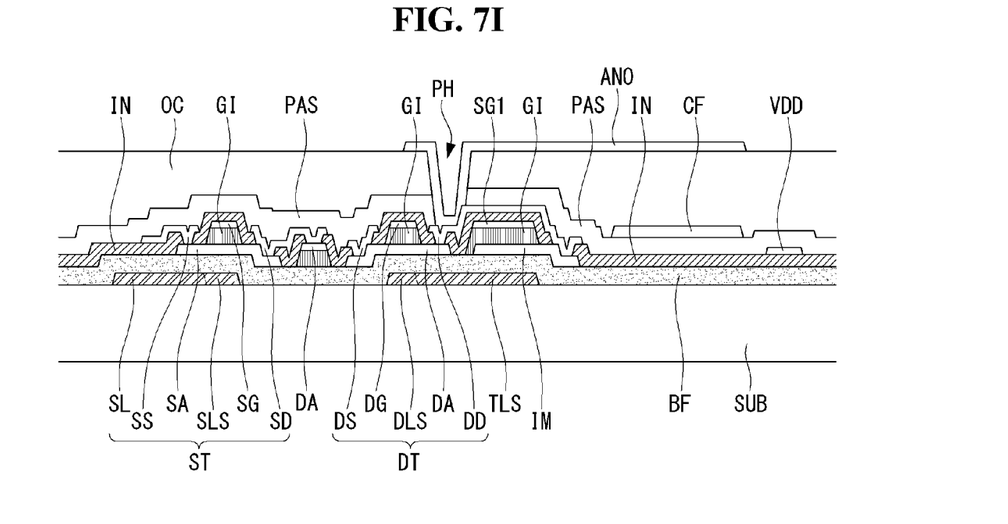

As shown in FIG. 7I, on the whole surface of the substrate SUB having the pixel contact hole PH, a transparent conductive material is deposited. By patterning the transparent conductive material using the ninth mask process, an anode electrode ANO is formed. The anode electrode ANO is connected to the drain electrode DD of the driving thin film transistor DT via the pixel contact hole PH.

Figure 7J:
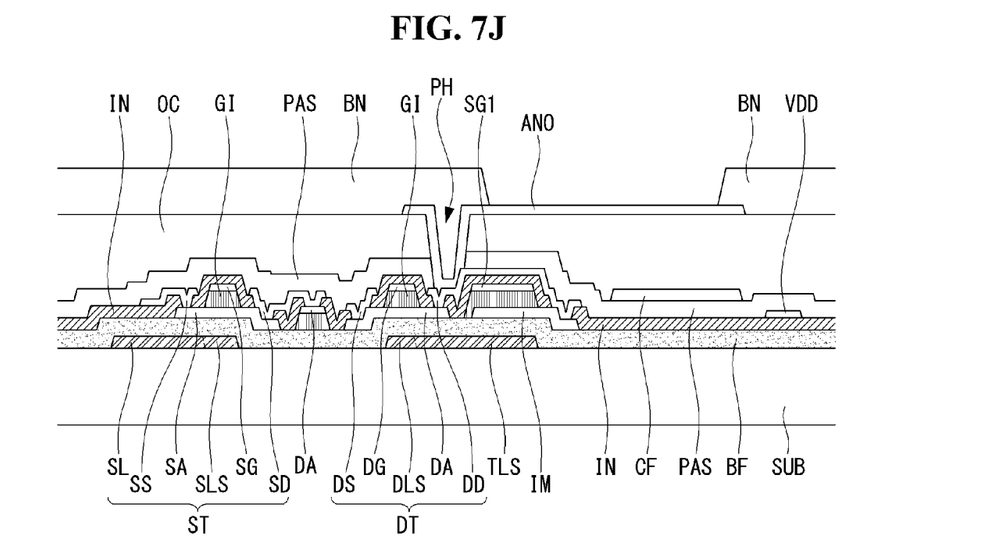

As shown in FIG. 7J, on the whole surface of the substrate SUB having the anode electrode ANO, an insulating material is deposited. By patterning the insulating material using the tenth mask process, the bank BN is formed. The bank BN defines the aperture area, the actual light emitting area. The bank BN has the shape as exposing most portions of the anode electrode ANO.

Figure 7K:
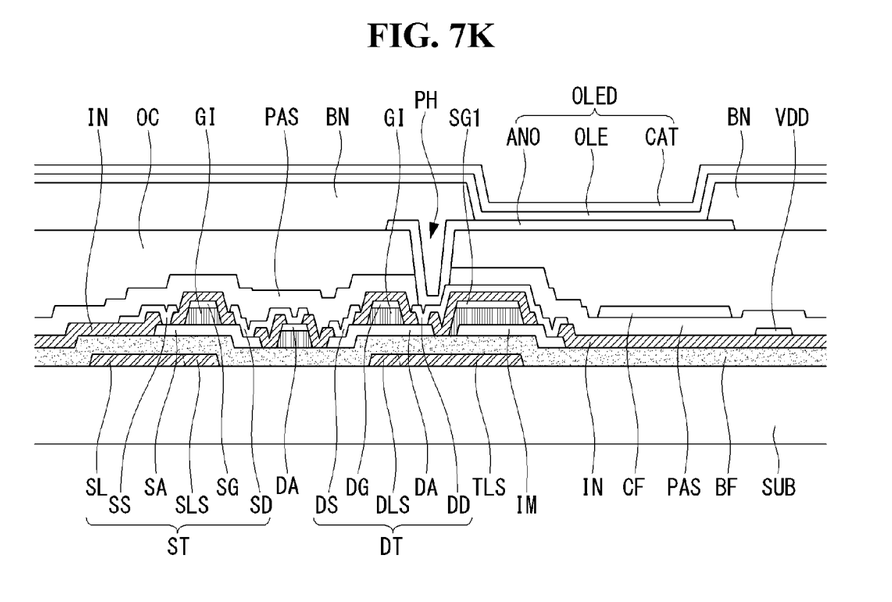

As shown in FIG. 7K, on the whole surface of the substrate SUB having the bank BN, an organic light emitting layer OLE and a cathode electrode CAT are sequentially deposited. As the color filter CF is disposed under the anode electrode ANO, the organic light emitting layer OLE preferably has the organic material radiating the white color light. As the result, the organic light emitting diode OLED including the anode electrode ANO, the organic light emitting layer OLE and the cathode electrode CAT is completed. As the anode electrode ANO is connected to the drain electrode DD of the driving thin film transistor DT, the organic light emitting diode OLED is driven by the driving thin film transistor DT.

Figure 8:
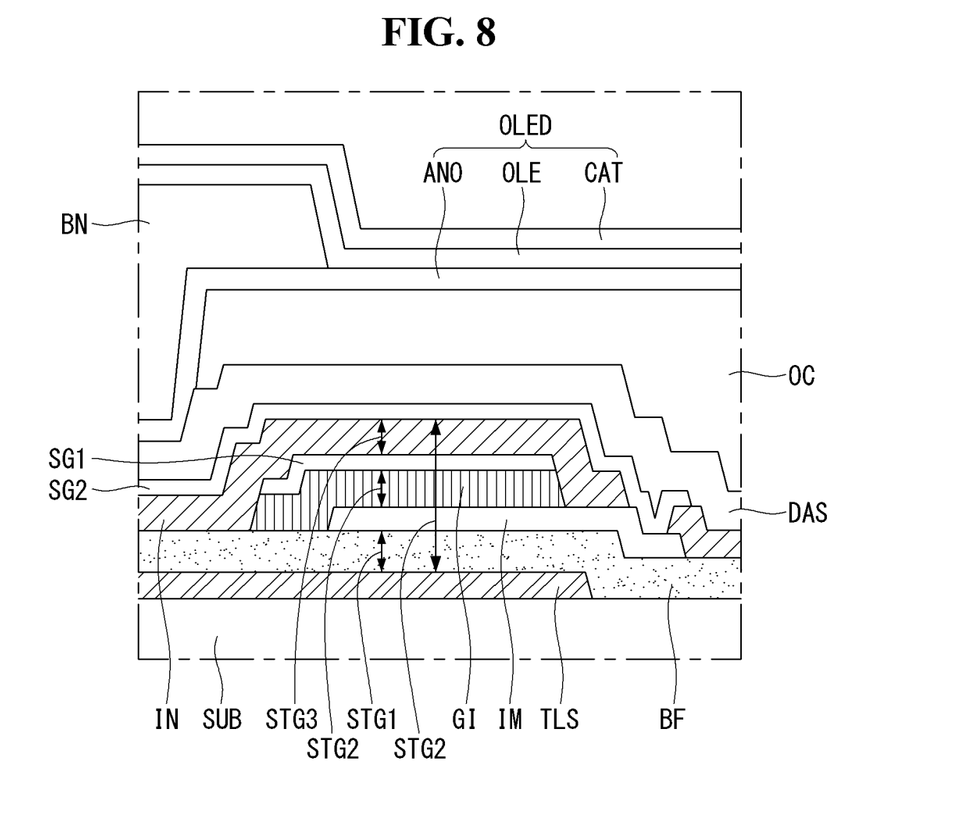
FIG. 8 is an enlarged cross sectional view illustrating the structure of a three-stack storage capacitor electrode in the organic light emitting diode display according to the preferred embodiment of the present disclosure.

FIG. 8 is an enlarged cross sectional view illustrating the structure of a three-stack storage capacitor electrode in the organic light emitting diode display according to the preferred embodiment of the present disclosure. Referring to FIG. 8, the organic light emitting diode display according to the present disclosure has the storage capacitor STG including the first storage capacitor STG1, the second storage capacitor STG2 and the third storage capacitor STG3. The first storage capacitor STG1 is formed between the additional storage capacitor electrode TSL extended from the light shield layer DLS and the intermediate electrode IM. The second storage capacitor STG2 is formed between the intermediate electrode IM and the first storage capacitor electrode SG1. The third storage capacitor STG# is formed between the first storage capacitor electrode SG1 and the second storage capacitor electrode SG2.

Especially, the intermediate electrode IM is electrically and physically connected to the second storage capacitor electrode SG2 and the first storage capacitor electrode SG1 is inserted between the intermediate electrode IM and the second storage capacitor electrode SG2. Therefore, the total storage capacitor has the physical and electrical structures to ensure enough amount of the storage capacitor. The pixel data written to the drain electrode DD of the driving thin film transistor DT is also stored to the second storage capacitor electrode SG2 and the intermediate electrode IM. Then, the stored pixel data can be maintained in the dielectric materials inserted between the additional storage capacitor electrode TLS and the intermediate electrode IM, between the intermediate electrode IM and the first storage capacitor electrode SG1, and between the first storage capacitor electrode SG1 and the second storage capacitor electrode SG2. As the result, when the driving thin film transistor DT is off state, the pixel data can be maintained in the anode electrode ANO with the stored electrons in the storage capacitor STG until next period.

According to the present disclosure, the storage capacitor STG of the organic light emitting diode display is formed as having three-stack structure. Therefore, even though the surface area of the storage capacitor is reduced, the volume of the storage capacitor is not reduced. That is, more electrons can be maintained in the less surface area of the storage capacitor. In other words, the area ratio of the storage capacitor in the pixel area can be reduced. For the bottom emission type, as the area of the storage capacitor can be reduced without reducing the amount of the storage capacitor, the light emitting area can be enlarged. That is, the present disclosure can suggest an organic light emitting diode display having a high aperture ratio.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. An organic light emitting diode display device comprising:
    a plurality of pixel areas disposed in a matrix on a substrate;
    a thin film transistor disposed in the pixel area;
    an organic light emitting diode connected to the thin film transistor and disposed in the pixel area; and
    a three-stack storage capacitor having first to fourth electrodes, wherein the second and fourth electrodes are electrically coupled to an anode electrode of the organic light emitting diode.

2. The device according to the claim 1, wherein the thin film transistor includes:
    a light shield layer blocking external lights induced to a channel layer and being a lower gate electrode;
    a buffer layer covering the light shield layer;
    a semiconductor layer having the channel layer overlapping with the light shield layer on the buffer layer;
    a upper gate electrode overlapping with the channel layer having a gate insulating layer there-between;
    an intermediate insulating layer covering the semiconductor layer and the upper gate electrode; and
    a source electrode and a drain electrode contact some portions of the semiconductor layer disposed both sides of the channel layer on the intermediate insulating layer.

3. The device according to the claim 2, wherein the three-stack storage capacitor includes:
    a first storage capacitor formed at some portions of the buffer layer disposed between an additional storage capacitor electrode and an intermediate electrode overlapped each other;
    a second storage capacitor formed at some portions of the gate insulating layer disposed between the intermediate electrode and a first storage capacitor electrode overlapped each other; and
    a third storage capacitor formed at some portions of the intermediate insulating layer disposed between the first storage capacitor electrode and a second storage capacitor electrode overlapped each other.

4. The device according to the claim 3, wherein the additional storage capacitor electrode is formed at the same layer and with the same material of the light shield layer, the first storage capacitor electrode is formed at the same layer and with the same material of the upper gate electrode, and the second storage capacitor electrode is extended from the drain electrode and connected to the intermediate electrode via a contact hole through the intermediate insulating layer and the gate insulating layer.

5. The device according to the claim 2, wherein the organic light emitting diode includes:

the anode electrode formed on a passivation layer and an over coat layer covering the thin film transistor, and connected to the drain electrode exposed from the passivation layer and the over coat layer;

an organic light emitting layer deposited on the anode electrode; and a cathode electrode deposited on the organic light emitting layer.

6. The device according to the claim 5, further comprising:

a color filter inserted between the passivation layer and the over coat layer and configured to define a light emitting area.

7. The device according to the claim 6, wherein the anode electrode includes a transparent conductive material, and the cathode electrode includes a reflective metal material.

8. An organic light emitting diode display device comprising:

a plurality of pixel areas disposed in a matrix on a substrate;

a thin film transistor disposed in the pixel area, the thin film transistor including a driving transistor;

an organic light emitting diode connected to the thin film transistor and disposed in the pixel area; and a three-stack storage capacitor having first to fourth electrodes, wherein the second and fourth electrodes are electrically coupled an anode electrode of the organic light emitting diode via a drain electrode of the driving transistor.

9. The device according to the claim 8, wherein the thin film transistor includes:

a light shield layer blocking external lights induced to a channel layer and being a lower gate electrode;

a buffer layer covering the light shield layer;

a semiconductor layer having the channel layer overlapping with the light shield layer on the buffer layer;

a upper gate electrode overlapping with the channel layer having a gate insulating layer there-between;

an intermediate insulating layer covering the semiconductor layer and the upper gate electrode; and a source electrode and a drain electrode contact some portions of the semiconductor layer disposed both sides of the channel layer on the intermediate insulating layer.

10. The device according to the claim 8, wherein the organic light emitting diode includes:

the anode electrode formed on a passivation layer and an over coat layer covering the thin film transistor, and connected to the drain electrode of the driving transistor exposed from the passivation layer and the over coat layer;

an organic light emitting layer deposited on the anode electrode; and a cathode electrode deposited on the organic light emitting layer.

11. The device according to the claim 10, further comprising:

a color filter inserted between the passivation layer and the over coat layer and configured to define a light emitting area.

12. The device according to the claim 10, wherein the anode electrode includes a transparent conductive material and the cathode electrode includes a reflective metal material.

* * * * *